(12) United States Patent
Choi

(10) Patent No.: US 6,445,604 B2
(45) Date of Patent: Sep. 3, 2002

(54) CHANNEL DRIVING CIRCUIT OF VIRTUAL CHANNEL DRAM

(75) Inventor: Young Jung Choi, Chungcheongbuk-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 09/864,202

(22) Filed: May 25, 2001

(30) Foreign Application Priority Data

May 31, 2000 (KR) ........................................ 2000-29769
May 31, 2000 (KR) ........................................ 2000-29785

(51) Int. Cl.[7] .............................................. G11C 5/06
(52) U.S. Cl. .................... 365/63; 365/208; 365/230.06; 365/230.08
(58) Field of Search ............................... 365/200, 201, 365/63, 203, 207, 208, 230.06, 230.08

(56) References Cited

U.S. PATENT DOCUMENTS 5,469,388 A * 11/1995 Park ............................ 365/200
6,144,577 A * 11/2000 Hidaka ........................ 365/63
6,233,181 B1 * 5/2001 Hidaka ........................ 365/200

* cited by examiner

*Primary Examiner*—David Nelms
*Assistant Examiner*—Gene N. Auduong
(74) *Attorney, Agent, or Firm*—Pillsbury Winthrop LLP

(57) ABSTRACT

A virtual channel DRAM arrangement is provided which can improve cell efficiency, reduce a layout area of a chip and increase a data processing speed, by unifying a data processing method. The virtual channel DRAM includes a plurality of channel block units consisting of first to fourth unit channel units where a plurality of normal channel registers and a plurality of redundancy channel registers are commonly connected through one local data bus, a plurality of I/O data bus connectors respectively connected between the local data bus of the unit channel units and global data buses, a plurality of channel control units respectively connected to one sides of the plurality of channel block units, for controlling the operation of the first to fourth unit channel units, a plurality of data bus sense amp units respectively connected between the global data buses and a global read data bus, for sensing input data in a normal read operation and a redundancy operation, and a plurality of write driver units respectively connected between the global data buses and a global write data bus, for driving input data.

30 Claims, 6 Drawing Sheets

CHANNEL DRIVING CIRCUIT OF VIRTUAL CHANNEL DRAM

BACKGROUND OF THE INVENTION

1. Field of the Invention

The present invention relates to a virtual channel DRAM, and in particular to an improved virtual channel DRAM which can improve cell efficiency, reduce a layout area of a chip and increase a data processing speed, by unifying a data processing method.

2. General Description and Related Art

FIG. 1 (Prior Art) is a schematic diagram of a channel structure of a conventional virtual channel DRAM. The virtual channel DRAM includes: sixteen channel block units 100_0~100_15 respectively consisting of four unit channel units 110~140 for temporarily storing all or part of a set of data electrically connected to a bit line according to an active command; and sixteen channel control units 20_0~20_15 connected to one sides of the sixteen channel block units 100_0~100_15, for controlling the four unit channel units 110~140. 128 normal channel registers 1 and four redundancy channel registers 2 are consecutively positioned in the respective unit channel units 110~140. The 128 normal channel registers 1 are connected to one another through a channel read bus 3, and the four redundancy channel registers 2 are connected to one another through a redundancy channel read bus 4. The 128 normal channel registers 1 and the four redundancy channel registers 2 are connected to each other through a channel write bus 5.

Read type I/O data bus connectors 6 and write type I/O data bus connectors 7 are connected between the channel control units 20_0~20_15 and the normal channel registers 1. The read type I/O data bus connectors 6 are respectively connected between the channel read bus 3 and data bus sense amp units 41, 43, 45, 47, and the write type I/O data bus connectors 7 are respectively connected between the channel write bus 5 and write driver units 51~54. Redundancy type I/O data bus connectors 8 are respectively connected between the redundancy channel read bus 4 and redundancy data bus sense amp units 42, 44, 46, and 48.

In addition, the data bus sense amp units 41, 43, 45, and 47 sense and amplify data output through the channel read bus 3 in a read operation and stored in the normal channel registers 1, and output them to a global read data bus grd. The redundancy data bus sense amp units 42, 44, 46, and 48 sense and amplify data outputt through the redundancy channel read bus 4 in the read operation and stored in the redundancy channel registers 2, and output them to the global read data bus grd.

The write driver units 51~54 drive a data inputted through a global write data bus gwd in a write operation, and output them to the write type I/O data bus connectors 7. And the virtual channel DRAM has column decoding units 131~134 for receiving column address signals through column address bus lines. The column decoding units 131~134 receive column address signals through the column address bus lines and selects column lines of a normal channel register 62 and a redundancy channel register 64 of the unit channel units 210~240 in a read or a write operation.

However, in the conventional virtual channel DRAM, the read type and write type I/O data bus connectors 6, 7 are connected to one channel control unit 20_0~20_15, thereby occupying a large layout area. In addition, the data bus sense amp units used in the read operation are divided into the normal type and redundancy type, thereby increasing power consumption as well as the layout area.

Moreover, in the unit channels 110~140, the 128 normal channel registers 1 and the redundancy channel registers 2 are connected through the channel write bus 5. Accordingly, a load is increased in the read operation, and thus a data processing speed is reduced.

SUMMARY

The claimed inventions feature, at least in part a virtual channel DRAM which can improve cell efficiency, reduce a layout area of a chip and increase a data processing speed, by unifying a data processing method.

There is provided a virtual channel DRAM including: a plurality of channel block units consisting of first to fourth unit channel units where a plurality of normal channel registers and a plurality of redundancy channel registers are commonly connected through one local data bus. A plurality of I/O data bus connectors are respectively connected between the local data bus of the unit channel units and global data buses. A plurality of channel control units are respectively connected to one sides of the plurality of channel block units, for controlling the operation of the first to fourth unit channel units. A plurality of data bus sense amp units are respectively connected between the global data buses and a global read data bus, for sensing input data in a normal read operation and a redundancy operation. A plurality of write driver units respectively connected between the global data buses and a global write data bus, for driving input data.

Some of the claimed inventions feature a virtual channel DRAM including a plurality of channel block units respectively consisting of first to fourth unit channel units. A plurality of normal channel registers and a plurality of redundancy channel registers are divided into halves at the right and left sides, and are respectively connected in series through a local data bus. A plurality of I/O data bus connectors are respectively connected between the local data bus of the unit channel units and global data buses. A plurality of channel control units are respectively connected to one sides of the plurality of channel block units, for controlling the operation of the first to fourth unit channel units. A plurality of data bus sense amp units are connected between the global data buses and a global read data bus one by one, for sensing input data in a normal read operation and a redundancy operation. A plurality of write driver units are respectively connected between the global data buses and a global write data bus, for driving input data.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION

Figure 1:
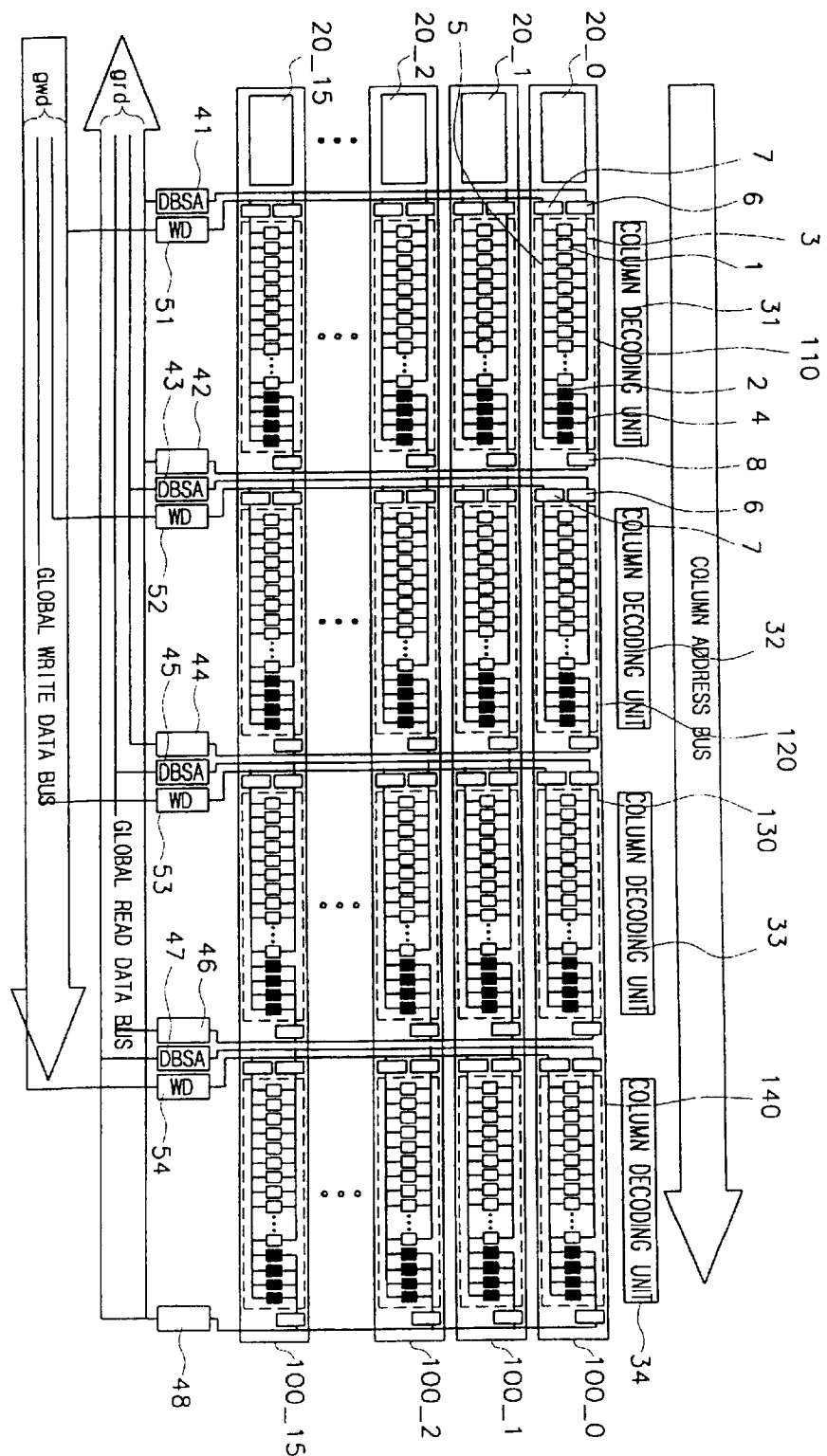
FIG. 1 (Prior Art) is a schematic diagram illustrating a channel structure of a conventional virtual channel DRAM.

A virtual channel DRAM in accordance with preferred embodiments of the present invention will now be described in detail with reference to the accompanying drawings. In the drawings, elements having an identical function are provided with the identical reference numeral, and repeated explanations thereof will be omitted.

Figure 2:
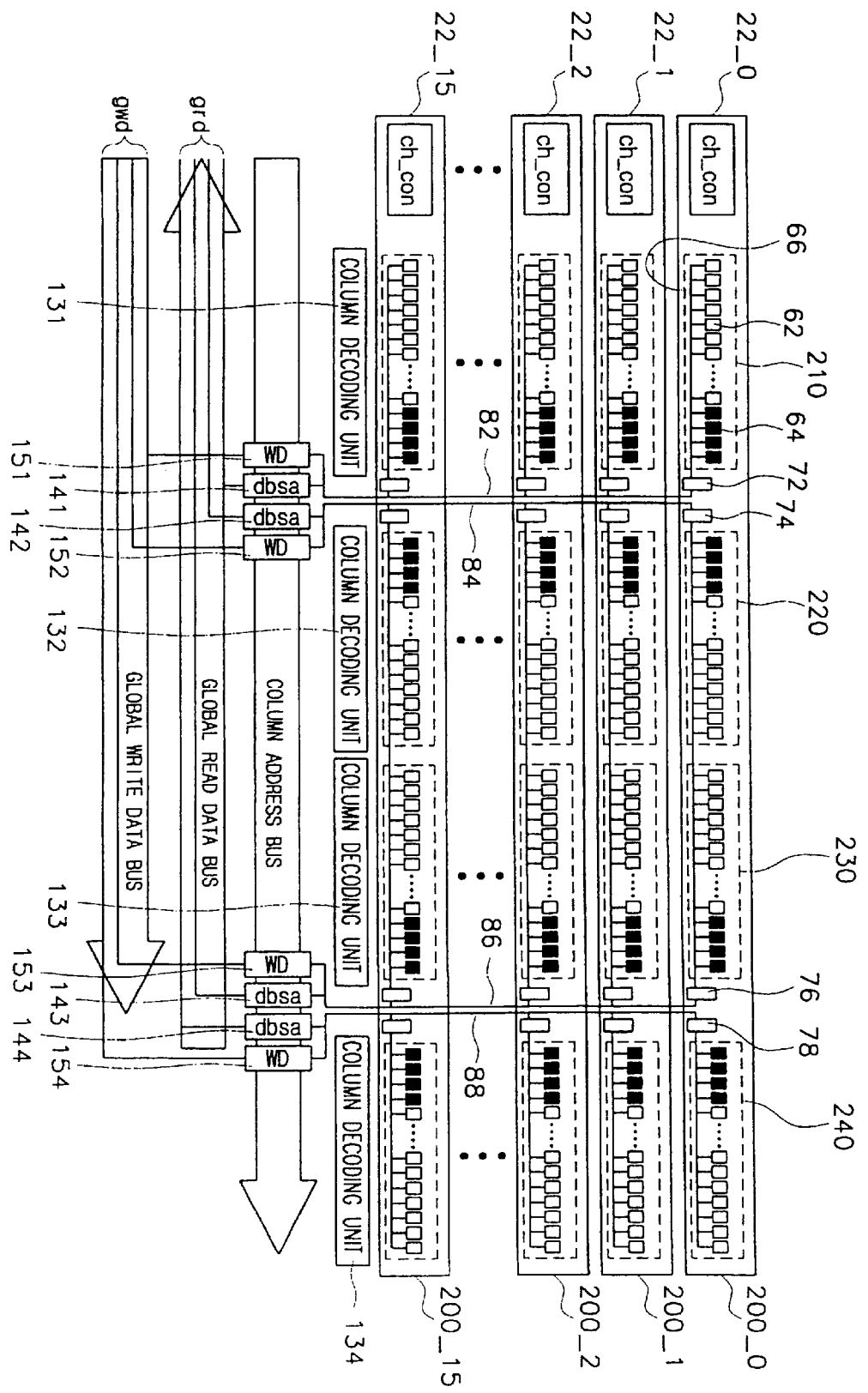
FIG. 2 is a schematic diagram illustrating a channel structure of a virtual channel DRAM in accordance with the present invention.

FIG. 2 is a schematic diagram illustrating a channel structure of the virtual channel DRAM in accordance with the present invention.

The virtual channel DRAM includes: first to sixteenth channel block units 200_0~200_15 respectively consisting of first to fourth unit channel units 210~240. 128 or more normal channel registers 62 and four redundancy channel registers 64 are commonly connected through one local data bus 66. First to sixteenth channel control units 22_0~22_15 are respectively connected to one sides of the first to sixteenth channel block units 200_0~200_15, for controlling the operation of the first to fourth unit channel units 210~240. First to fourth I/O data bus connectors 72, 74, 76, 78 are respectively connected to the local data bus 66 of the first to fourth unit channel units 210~240. A first global data bus 82 is commonly connected to the first I/O data bus connector 72 connected to the local data bus 66 of the first unit channel unit 210 of the first to sixteenth channel control units 22_0~22_15. A first write driver unit 151 and a first data bus sense amp unit 141 are commonly connected to the first global data bus 82. A second global data bus 84 is commonly connected to the second I/O data bus connector 74 connected to the local data bus 66 of the second unit channel unit 220 of the first to sixteenth channel control units 22_0~22_15. A second write driver unit 152 and a second data bus sense amp unit 142 are commonly connected to the second global data bus 84. A third global data bus 86 is commonly connected to the third I/O data bus connector 76 connected to the local data bus 66 of the third unit channel unit 230 of the first to sixteenth channel control units 22_0~22_15. A third write driver unit 153 and a third data bus sense amp unit 143 are commonly connected to the third global data bus 86. A fourth global data bus 88 is commonly connected to the fourth I/O data bus connector 78 connected to the local data bus 66 of the fourth unit channel unit 240 of the first to sixteenth channel control units 22_0~22_15. A fourth write driver unit 154 and a fourth data bus sense amp unit 144 are commonly connected to the fourth global data bus 88. And the virtual channel DRAM has column decoding units 131~134 for receiving column address signals through column address bus lines. The column decoding units 131~134 receive column address signals through the column address bus lines and selects column lines of a normal channel register 62 and a redundancy channel register 64 of the unit channel units 210~240 in a read or a write operation The first to fourth write driver units 151~154 are connected to a global write data bus gwd, and the first to fourth data bus sense amp units 141~144 are connected to a global read data bus grd.

The data bus sense amp units 141~144 are connected between one global data bus and the global read data bus grd one by one, and operated in a normal read operation and a redundancy operation at the same time. The write driver units 151~154 are connected between one global data bus and the global write data bus gwd one by one, for driving input data in a write operation.

The read operation of the virtual channel DRAM will now be described. When it is presumed that the channel register 62 of the first unit channel unit 210 of the first channel block unit 200_0 is selected by the first channel control unit 20_0, a read data is applied from the selected channel register 62 to the local data bus 66. The read data is transmitted to the first global data bus 82 through the first I/O data bus connector 72. Thereafter, the read data is sensed and amplified by the first data bus sense amp unit 140, and outputted to the global read data bus grd.

The write operation of the virtual channel DRAM will now be explained. When it is presumed that a write data inputted through the global write data bus gwd is inputted through the first write driver unit 151, the write data is transmitted to the first global data bus 82 outputting the read data in the read operation. The write data is transmitted to the first data bus connector 72 connected to the local data bus 66 of the first unit channel unit 210 of the first channel block unit 200_0 selected by the first channel control unit 22_0. Thereafter, the data inputted through the first data bus connector 72 is stored in the selected channel register 62 through the local data bus 66 of the first unit channel unit 210.

Accordingly, the virtual channel DRAM as illustrated in FIG. 2 connects the plurality of channel registers composing the unit channel units 210~240 through one local data bus 66, and aligns the I/O bus connectors for inputting or outputting the data to/from the local data bus 66 one by one, thereby reducing a number of the I/O bus connectors into a half, and also reducing a number of the global data buses connected to the I/O bus connectors into a half.

In addition, one data bus sense amp unit and one word line driver unit are connected to one global data bus, and thus a number of the data bus sense amp units is reduced into a half. As a result, as compared with the conventional virtual channel DRAM, the virtual channel DRAM in accordance with the present invention reduces the layout area into a half and improves the data processing speed.

Figure 3:
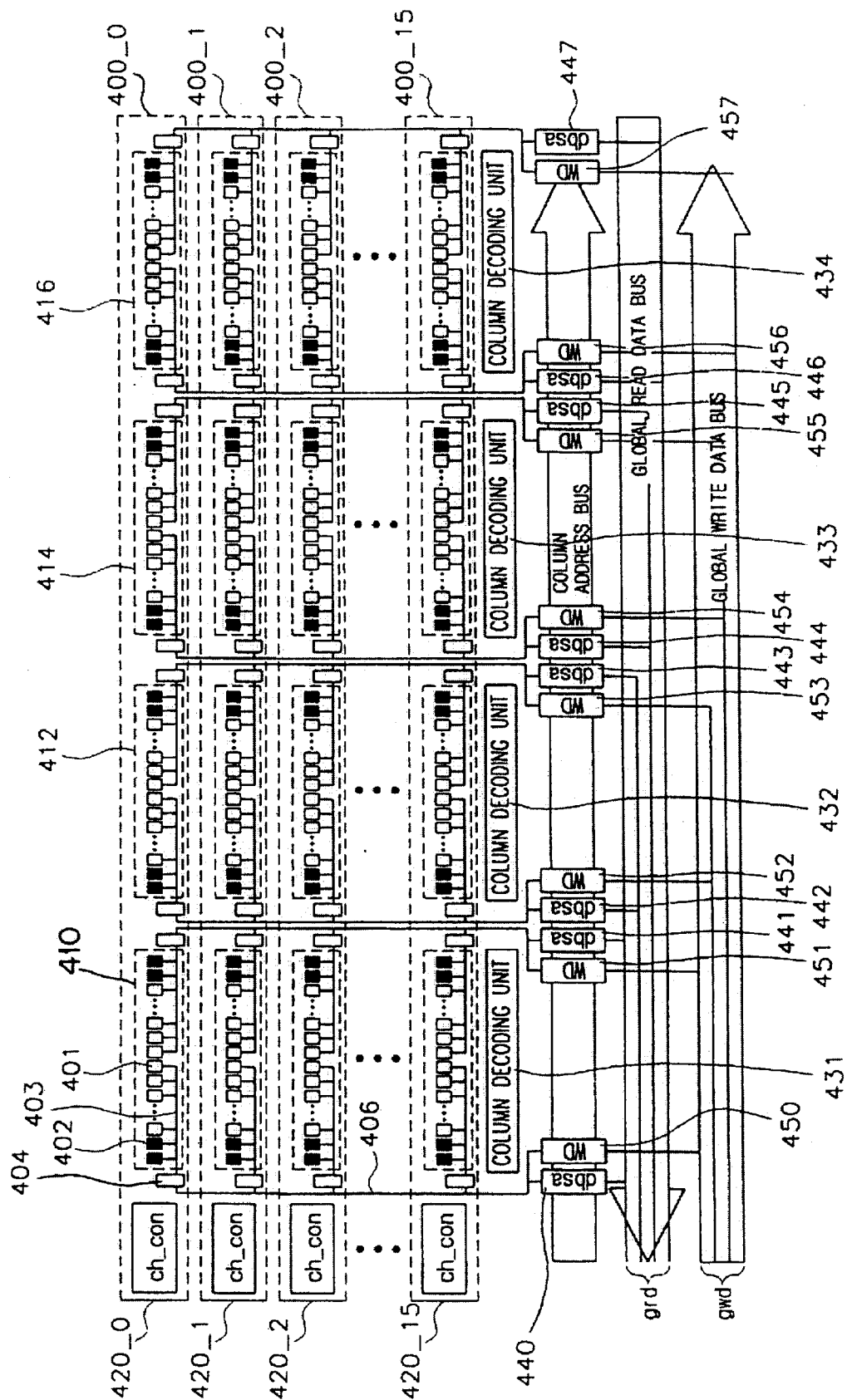
FIG. 3 is a schematic diagram illustrating a channel structure of a virtual channel DRAM in accordance with another embodiment of the present invention.

FIG. 3 is a schematic diagram illustrating a channel structure of a virtual channel DRAM in accordance with another embodiment of the present invention. The virtual channel DRAM includes: sixteen channel block units 400_0~400_15 respectively consisting of first to fourth unit channel units 410~416 for temporarily storing input data according to an active command. Sixteen channel control units 420_0~420_15 are connected to one sides of the sixteen channel block units 400_0~400_15, for controlling the operation of the first to fourth unit channel units 410~416. In one unit channel unit 410~416, 128 normal channel registers 401 and four redundancy channel registers 402 are divided into halves at the right and left sides. The divided 64 normal channel registers 401 and two redundancy channel registers 402 are connected in series through one local data bus 403. The local data bus 403 is connected to one global data bus 406 by one I/O data bus connector 404. The global data bus 406 is commonly connected to one data bus sense amp unit 440 and one write driver unit 450. And, the virtual channel DRAM has column decoding units 431~434 for receiving column address signals through column address bus lines. The column decoding units 431~434 receive column address signals through the column address bus lines and select column lines of a normal channel register 401 and a redundancy channel register 402 of the unit channel units 410~416 in a read or a write operation.

The data bus sense amp unit 440 is operated in a normal read operation and a redundancy operation, for sensing a data of the global data bus 406, and outputting it to the global read data bus grd. The write driver unit 450 drives a data inputted through the global write data bus in a write operation, and outputs the data to the global data bus 406.

The read operation of the virtual channel DRAM will now be explained. When it is presumed that the channel register 401 of the first unit channel unit 410 of the channel block unit 400_0 is selected by the channel control unit 422_0, a read data is applied from the selected channel register 401 to the local data bus 403. The read data is transmitted to the global data bus 406 through the I/O data bus connector 404. Thereafter, the read data is sensed and amplified in the data bus sense amp unit 440, and outputted to the global read data bus grd.

The write operation of the virtual channel DRAM will now be described. When it is presumed that a write data inputted through the global write data bus gwd is inputted through the first write driver unit 450, the data is transmitted to the global data bus 406 outputting the read data in the read operation. Thereafter, the write data is transmitted to the data bus connector 404 connected to the local data bus 403 of the first unit channel unit 410 of the channel block unit 400_0 selected by the channel control unit 420_0. The data inputted through the data bus connector 404 is stored in the selected channel register 401 through the local data bus 403 of the first unit channel unit 410.

Figure 4:
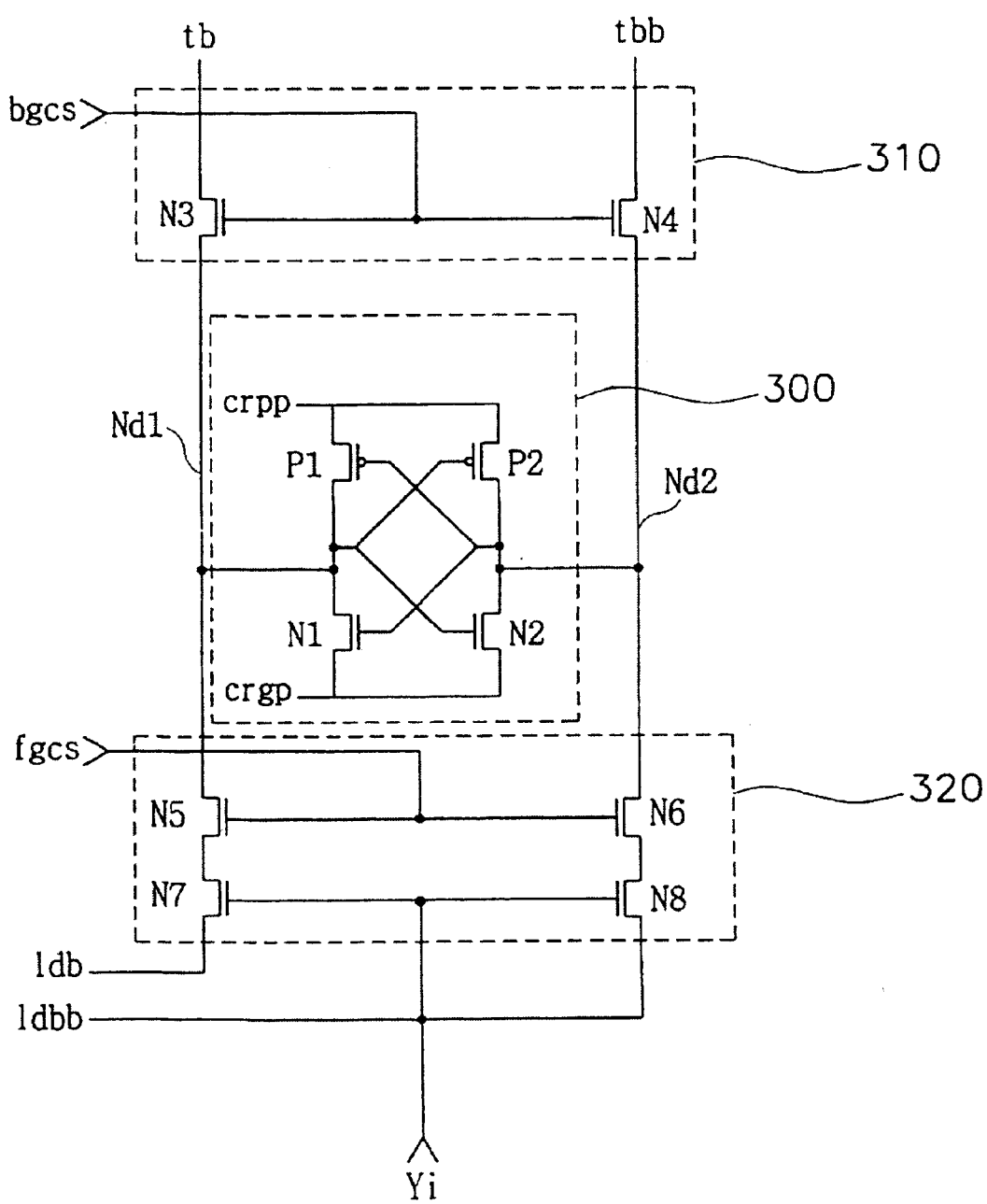
FIG. 4 is a circuit diagram illustrating channel registers of unit channel units in FIGS. 2 and 3.

As depicted in FIG. 3, the channel control units 420_0~420_15 for controlling the channel are connected in parallel to one side of the virtual channel DRAM, and 128 or more channel registers 400_0~400_15 are connected in series to the other side thereof. Referring to FIG. 4, the 128 or more channel registers 400_0~400_15 are divided into halves, thereby reducing a load and improving the data processing speed in the read or write operation.

FIG. 4 is a circuit diagram illustrating the channel registers 62, 401 of the unit channel units 210~240, 410~416 shown respectively in FIGS. 2 and 3. The channel registers 62, 401 respectively include a sensing and storing unit 300 for sensing and storing data. A first data transmission unit 310 inputs input data signals tb, tbb to the sensing and storing unit 300 according to a first control signal bgcs. A second data transmission unit 320 outputs data 1 db, 1 dbb sensed in the sensing and storing unit 300 according to a second control signal fgcs and a column selection signal Yi.

The sensing and storing unit 300 includes a first inverter consisting of a PMOS transistor P1 and an NMOS transistor N1 coupled between a power voltage supply line crpp and a ground voltage supply line crgp. A second inverter consists of a PMOS transistor P2 and an NMOS transistor N2 coupled between the power voltage supply line crpp and the ground voltage supply line crgp. The channel register consisting of the first and second inverters has a cross-coupled structure.

The first data transmission unit 310 includes NMOS transistors N3, N4 turned on when the first control signal bgcs is high. The second data transmission unit 320 includes: NMOS transistors N5, N6 turned on when the second control signal fgcs is high; and NMOS transistors N7, N8 turned on when the column selection signal Yi is high.

Figure 5:
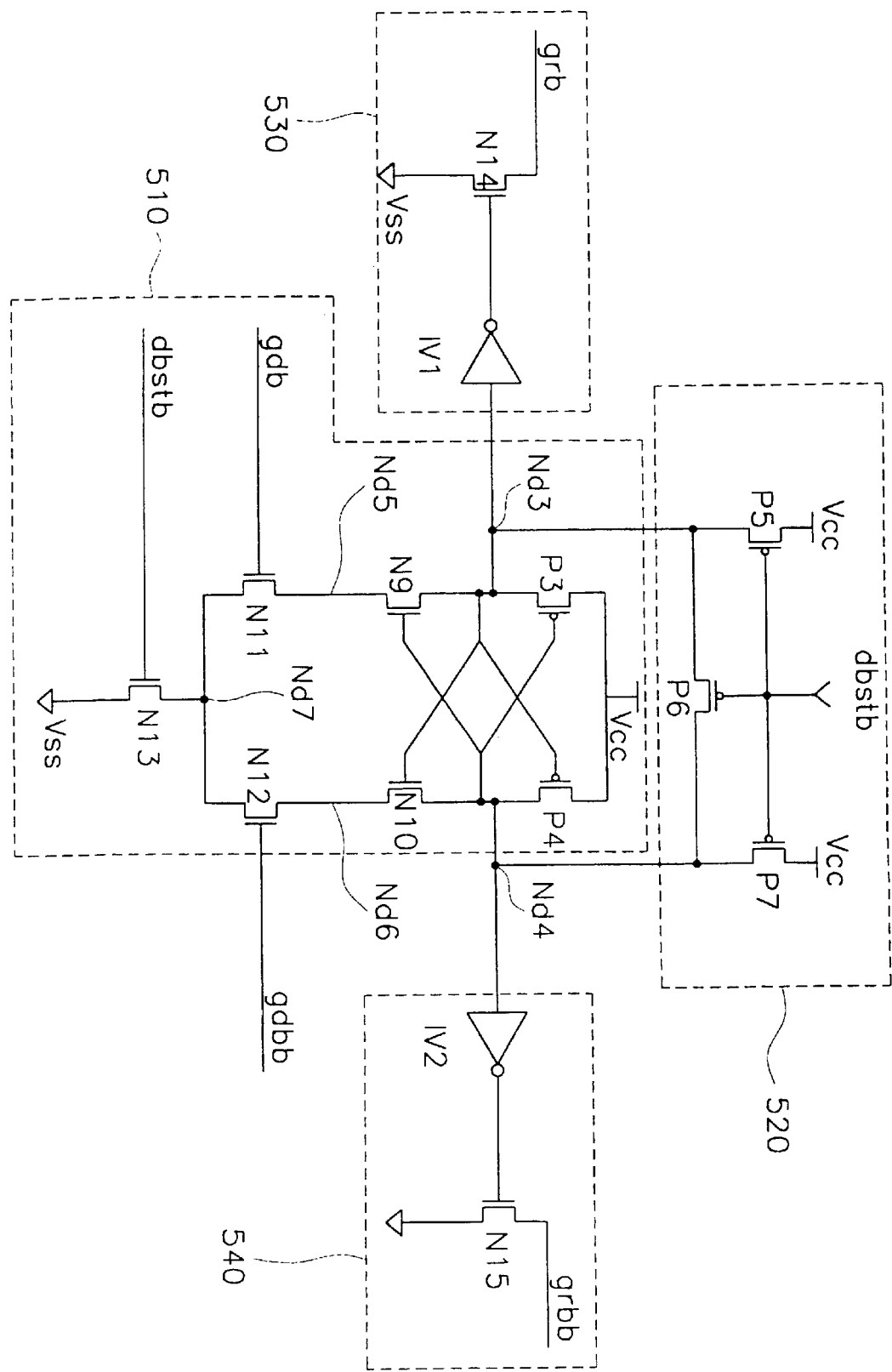
FIG. 5 is a circuit diagram illustrating write driver units in FIGS. 2 and 3.

FIG. 5 is a circuit diagram illustrating the write driver units 151~154, 451~457 in FIGS. 2 and 3. The write driverunits 151~154, 451~457 respectively include a differential amplification unit 510 for outputting differentially amplified signals of input signals gdb, gdbb to output nodes Nd3, Nd4, when a data bus strobe bar signal dbstb is high. A first output unit 530 outputs a low signal to a first output terminal grb according to the signal from the output node Nd3 of the differential amplification unit 510. A second output unit 540 outputs a low signal to a second output terminal grbb according to the signal from the output node Nd4 of the differential amplification unit 510. A precharge and equalization unit 520 precharges and equalizes potentials of the output nodes Nd3, Nd4 of the differential amplification unit 510 to a high state, when the data bus strobe bar signal dbstb is low.

The differential amplification unit 510 includes: a PMOS transistor P3 for transmitting the power voltage Vcc to the output node Nd3 by the output node Nd4. A PMOS transistor P4 transmits the power voltage Vcc to the output node Nd4 by the output node Nd3. An NMOS transistor N9 transmits the signal from the output node Nd3 to a node Nd5 by the output node Nd4. An NMOS transistor N10 transmits the signal from the output node Nd4 to a node Nd6 by the output node Nd3. An NMOS transistor N11 transmits the signal from the node Nd5 to a node Nd7 according to the input signal gdb. An NMOS transistor N12 transmits the signal from the node Nd6 to the node Nd7 according to the input signal gdbb. An NMOS transistor N13 discharges the signal from the node Nd7 to the ground voltage Vss according to the data bus strobe bar signal dbstb.

The first output unit 530 includes: an inverter IV1 for inverting the signal from the output node Nd3 of the differential amplification unit 510; and an NMOS transistor N14 for discharging a potential of the first output terminal grb to the ground voltage Vss, when the output signal from the inverter IV1 is high.

The second output unit 540 includes: an inverter IV2 for inverting the signal from the output node Nd4 of the differential amplification unit 510; and an NMOS transistor N15 for discharging a potential of the second output terminal grbb to the ground voltage Vss, when the output signal from the inverter IV2 is high.

The precharge and equalization unit 520 includes: a PMOS transistor P5 for supplying the power voltage Vcc to the output node Nd3 according to the data bus strobe bar signal dbstb. A PMOS transistor P7 supplies the power voltage Vcc to the output node Nd4 according to the data bus strobe bar signal dbstb. A PMOS transistor P6 equalizes the signals from the output nodes Nd3, Nd4 according to the data bus strobe bar signal dbstb.

The differential amplification unit 510 outputs the differentially-amplified signal to the output nodes Nd3, Nd4 respectively, according to the voltage of the data gdb, gdbb inputted to the gates of the NMOS transistors N11, N12, when the data bus strobe bar signal dbstb is enabled in a high state. When the data gdb is greater than the data bar gdbb, the current flowing through the NMOS transistor N5 is larger than the current flowing the NMOS transistor N6. Accordingly, the output node Nd1 has a low potential and the output node Nd2 has a high potential. When the output node Nd1 is in a low state, the NMOS transistor N14 of the first output unit 530 is turned on, thereby outputting a low level to the first output termninal grd. Here, the output node Nd4 is in a high state, the NMOS transistor N15 of the second output unit 540 is turned off, and thus the second output terminal grbb is in a high state in FIGS. 2 and 3.

Figure 6:
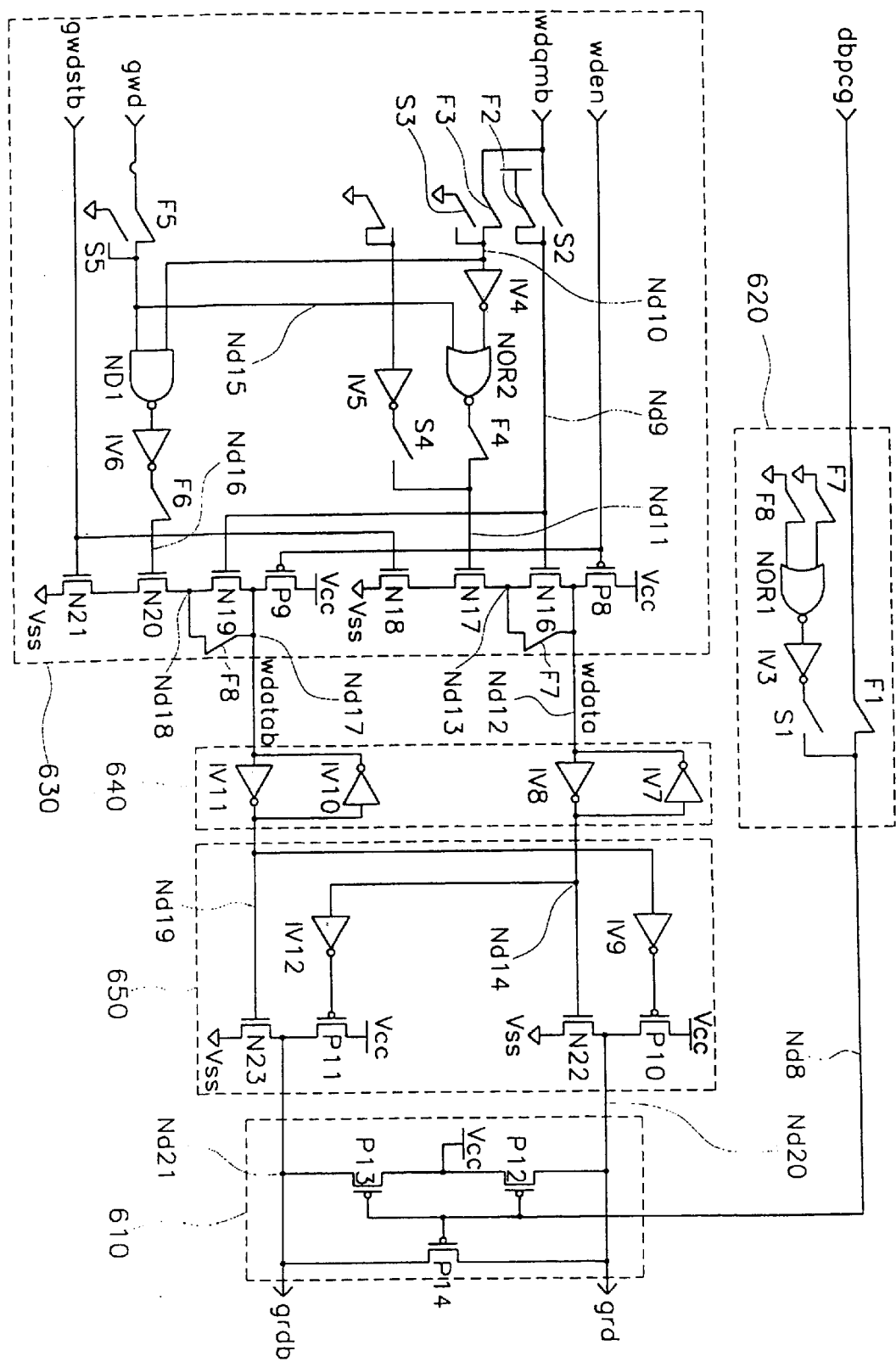
FIG. 6 is a circuit diagram illustrating data bus sense amp units in FIGS. 2 and 3.

FIG. 6 is a circuit diagram illustrating the data bus sense amp units 141~144, 440~447. The data bus sense amp units 141~144, 440~447 respectively include: a precharge unit 610 for prechaging a global read data bus line grd into a source voltage Vcc according to a data bus precharge signal dbpcg; a fuse unit 620 connected to an input terminal of the precharge unit 610 receiving the data bus precharge signal dbpcg; a first buffer unit 630 for receiving word line enable signals wden, data signals wdqmb received through the global data buses 82~88, 406, data signals gwd received through the global write data bus gwd and global write data strobe bar signals gwdstb and outputting a first data signal wdata and a second data signal wdatad; a latch unit 640 for receiving and storing the first data signal wdata and the second data signal wdatad from the first buffer unit 630; and a second buffer unit 650 for receiving data signals from the latch unit 640 and outputting the buffered signals to the global read data bus grd.

The unit data bus sense amp units 141~144, 440~447 in FIG. 6 receive data signals wdqmb from the global data buses 82~88, 406 in a read operation and output the sensed and amplified signals to the global read data bus grd. And, the unit data bus sense amp units 141~144, 440~447 receive data signals gwd from the global write data bus gwd in a write operation and output the sensed and amplified signals to the global data buses 82~88, 406.

As discussed earlier, in accordance with the present invention, the normal channel registers and the redundancy channel registers are connected to one local data bus and one I/O data bus connector, and the one I/O data bus connector is connected to one data bus sense amp unit and one word line driver unit through one global data bus. As a result, the number of the channel bus lines is reduced into a half, and the number of the I/O data bus connectors and the data bus sense amp units is reduced into a half. As compared with the conventional DRAM, the layout area of the virtual channel DRAM is reduced into a half, and thus the data processing speed thereof is improved.

In addition, in accordance with another embodiment of the present invention, 128 or more channel registers are divided into halves, thereby reducing the load and improving the data processing speed in the read or write operation. One I/O data bus connector is connected between the channel registers and the global bus lines, and used in the read and write operations. That is, the number of the I/O data bus connectors is reduced into a half. The number of the global bus lines from the I/O data bus connectors to the global read data bus or global write data bus is also reduced into a half. Moreover, one data bus sense amp unit and one write driver unit are connected to one global data bus. As compared with the conventional DRAM, the layout area of the virtual channel DRAM is reduced into a half, and the data processing speed thereof is improved. Moreover, one read and write path is provided in a data processing operation, thereby considerably reducing the layout area and improving the operation speed.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A channel driving circuit of virtual channel DRAM comprising:

N channel block units respectively including first to fourth unit channels where L normal channel registers and M redundancy channel registers are connected through one local data bus transmitting read and write data; first to fourth I/O data bus connectors respectively connected between local data buses of the first to the fourth unit channels and the first to the fourth global data buses; and a channel controller for selectively controlling the normal channel registers and the redundancy channel registers of the first to the fourth channels;

first to fourth data sense amp units respectively connected between the first to the fourth global data buses and a global read data bus, for sensing input data in a normal read operation and a redundancy operation; and first to fourth write driver units respectively connected between the first to the fourth global data buses and a global write data bus, for driving input data in a write operation.

2. The channel driving circuit of virtual channel DRAM according to claim 1, wherein the number L of the normal channel registers is 128.

3. The channel driving circuit of virtual channel DRAM according to claim 1, wherein the number M of the redundancy channel registers is 4.

4. The channel driving circuit of virtual channel DRAM according to claim 1, wherein the number N or the channel block units is 16.

5. The virtual channel DRAM according to claim 1, wherein the normal channel registers and the redundancy channel registers respectively comprise:

a sensing and storing unit for sensing and storing data;

a first data transmission unit for inputting input data signals to the sensing and storing unit according to a first control signal; and a second data transmission unit for outputting the data sensed in the sensing and storing unit according to a second control signal and a column selection signal.

6. The virtual channel DRAM according to claim 5, wherein the sensing and storing unit comprises:

a first inverter consisting of a PMOS transistor and an NMOS transistor between a power voltage supply line and a ground voltage supply line; and a second inverter having a cross-coupled structure with the first inverter, and consisting of a PMOS transistor and an NMOS transistor between the power voltage supply line and the ground voltage supply line.

7. The virtual channel DRAM according to claim 5, wherein the first data transmission unit comprises NMOS transistors.

8. The virtual channel DRAM according to claim 5, wherein the second data transmission unit comprises:

NMOS transistors switched according to the second control signal; and

NMOS transistors switched according to the column selection signal.

9. The virtual channel DRAM according to claim 1, wherein the write driver units respectively comprise:

a differential amplification unit for outputting differentially amplified signals of two input signals to first and second output nodes, when a data bus strobe bar signal is in a first potential state;

a first output unit for outputting a low or high signal to a first output terminal according to the signal from the first output node of the differential amplification unit;

a second output unit for outputting a low or high signal to a second output terminal according to the signal from the second output node of the differential amplification unit; and a precharge and equalization unit for precharging and equalizing potentials of the first and second output nodes of the differential amplification unit to the power voltage, when the data bus strobe bar signal is in a second potential state.

10. The virtual channel DRAM according to claim 9, wherein the first potential state is a logic high state and the second potential state is a logic low state.

11. The virtual channel DRAM according to claim 9, wherein the differential amplification unit is a CMOS type differential amplifier having a cross-coupled structure.

12. The virtual channel DRAM according to claim 9, wherein the first output unit comprises:
   a first inverter for inverting the signal from the first output node; and
   a first NMOS transistor for discharging a potential of the first output terminal to the ground voltage, when the output signal from the first inverter is in a high state.

13. The virtual channel DRAM according to claim 9, wherein the second output unit comprises:
   a second inverter for inverting the signal from the second output node; and
   a second NMOS transistor for discharging a potential of the second output terminal to the ground voltage, when the output signal from the second inverter is in a high state.

14. The virtual channel DRAM according to claim 9, wherein the precharge and equalization unit comprises:
   a first PMOS transistor for supplying the power voltage to the first output node according to the data bus strobe bar signal;
   a second PMOS transistor for supplying the power voltage to the second output node according to the data bus strobe bar signal; and
   a third PMOS transistor for equalizing the signals from the first and second output nodes according to the data bus strobe bar signal.

15. The virtual channel DRAM according to claim 1, wherein the data bus sense amp units respectively comprise:
   a precharge and equalization unit for prechaging and equalizing the global bus lines into the power voltage according to a data bus precharge signal;
   a fuse unit connected to a terminal of the precharge and equalization unit for receiving the data bus precharge signal;
   a first buffer unit for respectively buffering and outputting inputted write data and write data bar signals according to a write data enable signal and a global write data strobe bar signal;
   a latch unit for latching the output signals from the first buffer unit; and
   a second buffer unit for buffering the output signals from the latch unit, and outputting the buffered signals to the global read data bus lines.

16. The channel driving circuit of virtual channel DRAM comprising:
   N channel block units respectively including first to fourth unit channels where L/2 normal channel registers and M/2 redundancy channel registers are connected through a first local data bus and L/2 normal channel registers and M/2 redundancy channel registers are connected through a second local data bus; first to eighth I/O data bus connectors respectively connected between the first and the second local data buses and first to eighth global data buses; and a channel controller for selectively controlling the normal channel registers and the redundancy channel registers of the first to the fourth channels;
   first to eighth data sense amp respectively connected between the first to the eighth global data buses and a global read data bus one by one, for sensing input data in a normal read operation and a redundancy operation; and
   first to eighth write driver units respectively connected between the first to the eighth global data buses and a global write data bus, for driving input data in a write operation.

17. The channel driving circuit of virtual channel DRAM according to claim 16, wherein the number L of the normal channel registers is 120.

18. The channel driving circuit of virtual channel DRAM according to claim 16, wherein the number M of the redundancy channel registers is 4.

19. The channel driving circuit of virtual channel DRAM according to claim 16, wherein the number N of the channel block units is 16.

20. The virtual channel DRAM according to claim 16, wherein the normal channel registers and the redundancy channel registers respectively comprise:
   a sensing and storing unit for sensing and storing data;
   a first data transmission unit for inputting input data signals to the sensing and storing unit according to a first control signal; and
   a second data transmission unit for outputting the data sensed in the sensing and storing unit according to a second control signal and a column selection signal.

21. The virtual channel DRAM according to claim 20, wherein the sensing and storing unit comprises:
   a first inverter including a PMOS transistor and an NMOS transistor between a power voltage supply line and a ground voltage supply line; and
   a second inverter having a cross-coupled structure with the first inverter, and consisting of a PMOS transistor and an NMOS transistor between the power voltage supply line and the ground voltage supply line.

22. The virtual channel DRAM according to claim 20, wherein the first data transmission unit comprises NMOS transistors.

23. The virtual channel DRAM according to claim 20, wherein the second data transmission unit comprises:
   NMOS transistors switched according to the second control signal; and
   NMOS transistors switched according to the column selection signal.

24. The virtual channel DRAM according to claim 16, wherein the write driver units respectively comprise:
   a differential amplification unit for outputting differentially amplified signals of two input signals to first and second output nodes, when a data bus strobe bar signal is in a first potential state;
   a first output unit for outputting a low or high signal to a first output terminal according to the signal from the first output node of the differential amplification unit;
   a second output unit for outputting a low or high signal to a second output terminal according to the signal from the second output node of the differential amplification unit; and
   a precharge and equalization unit for precharging and equalizing potentials of the first and second output nodes of the differential amplification unit to the power voltage, when the data bus strobe bar signal is in a second potential state.

25. The virtual channel DRAM according to claim 24, wherein the first potential state is a logic high state and the second potential state is a logic low state.

26. The virtual channel DRAM according to claim 24, wherein the differential amplification unit is a CMOS type differential amplifier having a cross-coupled structure.

27. The virtual channel DRAM according to claim 25, wherein the first output unit comprises:
   a first inverter for inverting the signal from the first output node; and
   a first NMOS transistor for discharging a potential of the first output terminal to the ground voltage, when the output signal from the first inverter is in a high state.

28. The virtual channel DRAM according to claim 25, wherein the second output unit comprises:
   a second inverter for inverting the signal from the second output node; and
   a second NMOS transistor for discharging a potential of the second output terminal to the ground voltage, when the output signal from the second inverter is in a high state.

29. The virtual channel DRAM according to claim 25, wherein the precharge and equalization unit comprises:
   a first PMOS transistor for supplying the power voltage to the first output node according to the data bus strobe bar signal;
   a second PMOS transistor for supplying the power voltage to the second output node according to the data bus strobe bar signal; and
   a third PMOS transistor for equalizing the signals from the first and second output nodes according to the data bus strobe bar signal.

30. The virtual channel DRAM according to claim 16, wherein the data bus sense amp units respectively comprise:
   a precharge and equalization unit for prechaging and equalizing the global bus lines into the power voltage according to a data bus precharge signal;
   a fuse unit connected to a terminal of the precharge and equalization unit for receiving the data bus precharge signal;
   a first buffer unit for respectively buffering and outputting inputted write data and write data bar signals according to a write data enable signal and a global write data strobe bar signal;
   a latch unit for latching the output signals from the first buffer unit; and
   a second buffer unit for buffering the output signals from the latch unit, and outputting the buffered signals to the global read data bus lines.

* * * * *